United States Patent
Ruigrok et al.

(10) Patent No.: US 6,486,662 B1
(45) Date of Patent: Nov. 26, 2002

(54) MAGNETIC FIELD SENSOR COMPRISING A SPIN-TUNNEL JUNCTION

(75) Inventors: Jacobus J. M. Ruigrok, Eindhoven (NL); Reinder Coehoorn, Eindhoven (NL); Pieter J. Van Der Zaag, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/179,166

(22) Filed: Oct. 26, 1998

(30) Foreign Application Priority Data

Oct. 29, 1997 (EP) ............................................. 97202566

(51) Int. Cl.$^7$ ................................................. G11B 5/39
(52) U.S. Cl. ...................... 324/252; 360/321; 360/324.2
(58) Field of Search ................................. 324/252, 235; 338/32 R; 428/692, 900; 360/324.2, 321

(56) References Cited

U.S. PATENT DOCUMENTS

| | | | |
|---|---|---|---|
| 5,206,590 A | 4/1993 | Dieny et al. | 324/252 |
| 5,452,163 A * | 9/1995 | Coffey et al. | 360/324 |
| 5,493,467 A * | 2/1996 | Cain et al. | 360/321 |
| 5,636,093 A | 6/1997 | Gijs et al. | 360/113 |
| 5,898,547 A | 4/1999 | Fontana, Jr. et al. | 360/113 |

OTHER PUBLICATIONS

"Giant Magnetoresistance in Spin–Valve Multilayers" B. Dieny, Journal of Magnetism and Magnetic Materials 136, 1994, pp. 335–359.

Low–Field Magnetoresistance in Magnetic Tunnel Junctions Prepared by Contact Masks and Lithography: 25% Magnetoresistance at 295 K in Mega–Ohm Micron–Sized Junctions (Abstract), S.S.P. Parkin et al, IBM Research Division, J. Appl. Phys. 81 (8), Apr. 15, 1997.

"Conductance and Exchange Coupling of Two Ferromagnets Separated by a Tunneling Barrier" J.C. Slonczewski, IBM Research Division, Physical Review B, vol. 39, No. 10, Apr. 1, 1989, pp. 6995–7002.

* cited by examiner

*Primary Examiner*—Walter E. Snow

(57) ABSTRACT

A magnetic field sensor comprises a transducer element, which:

transducer element is a Spin Tunnel Junction, comprising a first and second magnetic layer which are sandwiched about an interposed electrical insulator layer; the sensor comprises a yoke having two arms; and the first magnetic layer is in direct contact with a first portion of a first arm of the yoke.

12 Claims, 1 Drawing Sheet

MAGNETIC FIELD SENSOR COMPRISING A SPIN-TUNNEL JUNCTION

BACKGROUND OF THE INVENTION

The invention relates to a magnetic field sensor comprising a transducer element. Such sensors may be employed inter alia:

- as magnetic heads, which can be used to decrypt the magnetic flux emanating from a recording medium in the form of a magnetic tape, disc or card;
- in compasses, for detecting the terrestrial magnetic field, e.g. in automotive, aviation, maritime or personal navigation systems;
- in apparatus for detecting position, angle, velocity or acceleration, e.g. in automotive applications;
- as field sensors in medical scanners, and as replacements for Hall probes in various other applications;
- as current detectors, whereby the magnetic field produced by such a current is detected.

Sensors as specified in the opening paragraph are well known in the prior art. The transducer element in such sensors typically comprises a magneto-resistance element, which translates magnetic flux variations into a correspondingly fluctuating electrical resistance R; a measure of the performance of the element is then expressed in the so-called magneto-resistance (MR) ratio, which quantifies the maximum change in R as a function of applied magnetic field. Sensors of this type may be based on one of the following effects:

- The Anisotropic Magneto-Resistance effect (AMR), whereby R in a magnetic body is dependent on the orientation of the body's magnetization with respect to the direction of electrical current flow through the body; or
- The Giant Magneto-Resistance effect (GMR), whereby R is determined by the relative orientation of the magnetization vectors in two distinct magnetic bodies, for example:
  - two layers which are sandwiched about an interposed metallic layer (interlayer), thus forming a so-called spin-valve trilayer (see, for example, the elucidation given by B. Dieny et al in U.S. Pat. No. 5,206,590 and J. Magn. Magn. Mater. 136 (1994), pp 335–359);
  - a multilayer comprising a plurality of stacked F/M bilayers, in which F is a ferromagnetic layer and M is a metallic layer, neighboring F-layers being antiferromagnetically coupled across intervening M-layers.

A disadvantage of known sensors based on AMR and GMR is that they demonstrate a relatively small MR ratio. Typically, the room-temperature MR values for AMR sensors are of the order of about 2%, whereas those for practical GMR sensors are generally of the order of about 5–10% at best. Consequently, such conventional sensors are relatively insensitive.

SUMMARY OF THE INVENTION

It is an object of the invention to provide a more sensitive magnetic field sensor. In particular, it is an object of the invention to provide a sensor which exploits a magneto-resistance effect with a room-temperature MR ratio of the order of 15% or more. Moreover, it is an object of the invention that such a sensor should be relatively compact, entailing an efficient use of materials and space.

These and other objects are achieved according to the invention in a magnetic field sensor comprising a transducer element, characterized in that:

I. the transducer element is a Spin Tunnel Junction, comprising a first and second magnetic layer which are sandwiched about an interposed electrical insulator layer (interlayer);
II. the sensor comprises a yoke having two arms;
III. the first magnetic layer is in direct contact with a first portion of a first arm of the yoke.

The principles of Spin Tunnel Junctions (STJs) are discussed in detail in an article by J. C. Slonczewski in Phys. Rev. B 39 (1989), pp 6995–7002, and a study of the properties of a particular STJ is presented in an article by S. S. P. Parkin et al. in J. Appl. Phys. 81 (1997), 5521. Because the STJ contains electrically insulating material (its interlayer) instead of purely metallic material, the principle of operation of an STJ is radically different to that of conventional AMR or GMR elements. For example, in a GMR element, the electrical resistance is metallic, and is mediated by spin-dependent scattering effects; on the other hand, in an STJ, the electrical resistance is mediated by spin-dependent tunneling effects. Another difference is that, in a (practical) AMR or GMR element, the measurement current is directed parallel to the plane of the element; on the other hand, in an STJ, the measurement current must be directed (tunneled) across the interlayer, and so is directed perpendicular to the plane of the element. These differences help account for the most dramatic advantages of an STJ: because of the STJ's high tunnel resistance, the measurement current can afford to be very small (of the order of 1 about $\mu A$, or less), and the room-temperature, low-field MR-ratio of an STJ is routinely of the order of at least 15%.

The term "magnetic layer" as used with reference to an STJ should be broadly interpreted. Such a magnetic layer may, for example, be comprised of one of the following:

- a single layer of ferromagnetic material;
- a ferromagnetic film which is accompanied by a thin, metallic, non-magnetic film on the side adjacent to the nearest yoke-arm;
- two ferromagnetic films which are exchange-coupled across an interposed electrically conducting film;
- a ferromagnetic film which is arranged in a stack with a pinning structure (examples of which are given hereinbelow in Embodiment 1), the pinning structure serving to directionally fix the magnetization in the adjacent ferromagnetic film.

In all cases, it is important to realize that the magnetic layer does not contain any electrically insulating films; the only electrically insulating structure in the STJ is the tunnel barrier (interlayer) between the first and second magnetic layers.

When a AMR or GMR transducer element is employed in a yoke-type magnetic field sensor, the element is electrically insulated from the yoke, e.g. by the use of a so-called separation-oxide layer between the element and the yoke; this is to prevent the yoke-arm from acting as an electrical shunt around the transducer element (in which, as has already been explained, the measurement current is parallel to the plane of the element and also to the top surface of the yoke-arm). However, the presence of an insulating layer between the yoke and the transducer element reduces the magnetic contact between the two, which accordingly reduces the efficiency of the sensor. This acts as a deterrent to the use of a yoke in conjunction with conventional sensors. In contrast, the inventors have realized that, when an STJ is employed instead of a conventional magnetoresistance transducer element, the use of a yoke becomes a more viable possibility. This is because the measurement current through the STJ is directed perpendicular to its plane, so that a yoke-arm in electrical contact with one of the magnetic layers of the STJ does not act as an electrical shunt around the transducer; the presence of a special separation-oxide layer between the STJ and the yoke is thus unnecessary. For this reason, the invention stipulates that the STJ be in direct contact with the yoke, thereby guaranteeing good magnetic contact and optimal efficiency. Moreover, the yoke-arm which is in contact with the magnetic layer of the STJ also serves as an electrical contact to that magnetic layer, which alleviates the need to provide electrical contact via a separate lead. In addition, the absence of a separation-oxide layer reduces the quantity of materials required in the sensor, simplifies its manufacturing procedure, and allows it to be more compact.

The yoke-type magnetic field sensor according to the invention is particularly advantageous when employed as a contact magnetic head, e.g. when reading magnetic tape or a hard disc. This is because it is then the relatively durable yoke which makes contact with the recording medium, instead of the relatively fragile transducer element. Apart from an advantage in terms of mechanical wear, this configuration additionally leads to reduced thermal noise.

In an advantageous embodiment of the sensor according to the invention, the said first portion of the first arm of the yoke constitutes the first magnetic layer of the STJ, i.e. the first yoke-arm plays the role of first magnetic layer in the STJ. In such an embodiment, the first yoke-arm does not contain a magnetic gap underneath the STJ, but is instead continuous. This embodiment therefore has the advantage that:

- it is even more compact and economic, since a distinct first magnetic layer is not required in addition to the yoke;.
- it is easier to manufacture, since a magnetic gap does not have to be created in the employed yoke.

In an embodiment suitable for use in extremely small sensors (i.e. sensors for which the so-called characteristic length is very small), a second portion of the second arm of the yoke constitutes the second magnetic layer. Such an embodiment is even more compact, since the different arms of the yoke now play the role of both the first and second magnetic layers. In this latter embodiment, it is important that the two yoke-arms be electrically insulated from one another, so as to prevent the formation of a short circuit across the STJ.

A further refinement of the first embodiment in the previous paragraph is characterized in that the thickness $t_1$ of the first portion of the first arm of the yoke is less than the thickness of the rest of the first arm immediately adjacent thereto. By locally thinning the first arm in this manner, magnetic flux in the first portion becomes more concentrated, thus serving to increase the sensitivity of the sensor. This effect is increased even further if the thickness $t_2$ of the second portion of the second arm of the yoke is also less than the thickness of the rest of the second arm immediately adjacent thereto; in that case, magnetic flux also becomes more concentrated in the second portion, causing a further increase in sensitivity of the sensor.

The skilled artisan will immediately appreciate that, if the STJ is to be useful as a sensor, the respective magnetizations $M_1$ and $M_2$ in the first and second magnetic layers must change their relative orientation as a function of applied magnetic field. This can, for example, be achieved by employing different magnetic materials in the two layers, or by ensuring that $M_1$ and $M_2$ are mutually perpendicular in the quiescent state (e.g. using exchange biasing). As an alternative, a particular rendition of the embodiments described in the previous paragraph is characterized in that $t_2 > t_1$. In such an embodiment, the discrepant values of $t_1$ and $t_2$ result in different flux concentrations in the first and second yoke-arms, respectively, so that, when a given external magnetic field is offered to the yoke, $M_1$ and $M_2$ will rotate to different extents. Good results are achieved for sensors in which the value of $t_2/t_1$ lies in the range 2–30, with particularly good results at $t_2/t_1 \approx 10$.

In addition to the transducer and the yoke, the sensor according to the invention may comprise various other structures. For example:

- in the case whereby only one of the magnetic layers of the STJ is in contact with the yoke, the other magnetic layer of the STJ will have to be provided with an electrical contact lead;
- a test/biasing conductor may be provided (e.g. as illustrated in FIG. 4).

BRIEF DESCRIPTION OF THE DRAWINGS

In the drawing.

Corresponding features in the various Figures are denoted using the same reference symbols.

DETAILED DESCRIPTION OF THE INVENTION

Embodiment 1

Figure 1:
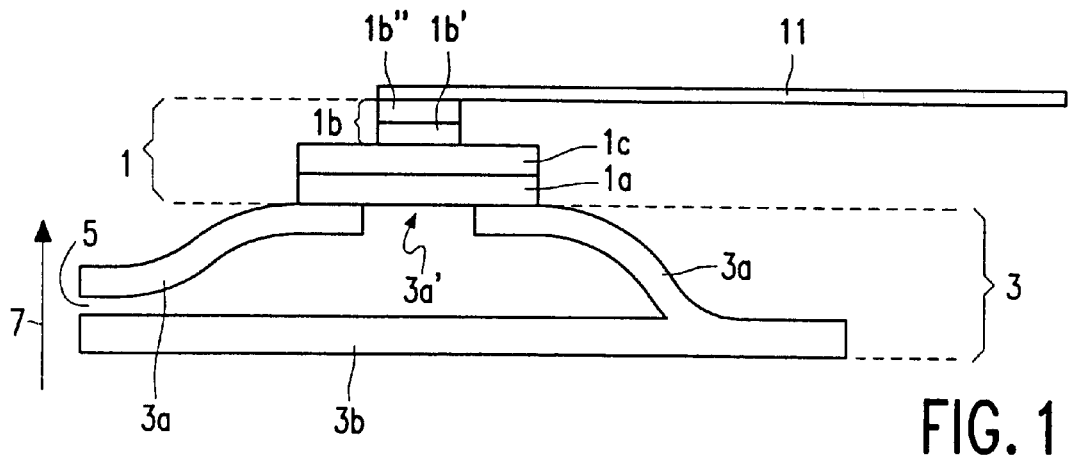
FIG. 1 is a cross-sectional view of a particular embodiment of a magnetic field sensor according to the invention, and shows a yoke-type magnetic field sensor comprising an STJ.

The invention will now be describe in greater detail with reference to the figures of the drawing and the following examples.

FIG. 1 shows a cross-sectional view of part of a magnetic field sensor according to the present invention. The sensor comprises a transducer 1 and a yoke 3 which has two arms 3a,3b. The transducer 1 is a Spin Tunnel Junction (STJ), and is comprised of a first magnetic layer 1a and a second magnetic layer 1b which are sandwiched about, and exchange-coupled across, a thin, intervening electrically insulating layer 1c (the tunnel barrier). The layer 1a may be comprised of a material such as Co, $Ni_xFe_{1-x}$ or $Co_xFe_{1-x}$, for example, and will generally have a thickness of the order of about 2–30 nm; on the other hand, the material of the interlayer 1c may, for example, be an oxide of Al or Hf, or a nitride of Al, with, in this case, a thickness of the order of about 1–2 nm (which is so small that significant spin-conservative electron tunnelling across the layer 1c can occur in the presence of an electrical field across that layer, without an excessively high resistance). The yoke 3 may be comprised of a material similar or identical to that of the layer 1a. In accordance with the invention, the magnetic layer 1a of the STJ is in direct contact with the arm 3a of the yoke 3, without the intervention of an insulating layer (e.g. a separation-oxide layer). The composition of the layer 1b is discussed below.

In this particular embodiment, the sensor is employed as a magnetic read head. The arms 3a,3b of the yoke 3 are separated at one end by a narrow gap 5, which typically has a height ("gap length") of the order of about 150–250 nm. When a magnetic medium passes in front of and in close proximity to the gap 5, the (varying) magnetic flux thus generated is carried by the yoke 3 to the transducer 1. As a result of the magnetic gap 3a' in the first arm 3a of the yoke 3, flux carried by that arm 3a will divert into the transducer 1.

Separate electrical contact must be made with the layers 1a and 1b, so as to generate a measurement current which can tunnel (substantially perpendicularly) through the tunnel barrier 1c. Electrical contact with the layer 1a is conveniently made via the yoke-arm 3a; on the other hand, electrical contact with the layer 1b must be made using a separate lead 11.

As here depicted, the magnetic layer 1b has a composite structure, and comprises a ferromagnetic film 1b' which is arranged in a stack with a pinning structure 1b". The (metallic) pinning structure 1b" serves to directionally "fix" the magnetization $M_2$ in the film 1b'; to this end, it may, for example, comprise one or more of the following:

An antiferromagnetic material, such as $Fe_{50}Mn_{50}$. In this case, $M_2$ is fixed by means of exchange biasing with the film 1b";

A hard-magnetic ferromagnetic material, such as Co. In this case, $M_2$ is fixed purely by the coercive force exerted by the magnetization of the film 1b";

A so-called artificial antiferromagnetic (AAF) structure. The structure 1b" is then a stack comprising a permanent-magnetic film F which is separated from the film 1b' by an interposed metallic film M. In this case, $M_2$ is. fixed predominantly by exchange coupling with the film F across the layer M. Since $M_2$ is fixed in this manner, whereas the magnetization $M_1$ in the layer 1a is free, it is possible to alter the relative orientation of $M_1$ and $M_2$ under the influence of an external magnetic field. This, in turn, induces corresponding alterations in the electrical resistance of the trilayer 1a, 1b, 1c, which are measured with the aid of the measurement current passing through the STJ 1 between the contact 3a and the contact 11. In a particularly sensitive embodiment, $M_1$ and $M_2$ are biased so as to be mutually perpendicular in the quiescent state.

Embodiment 2

Figure 2:
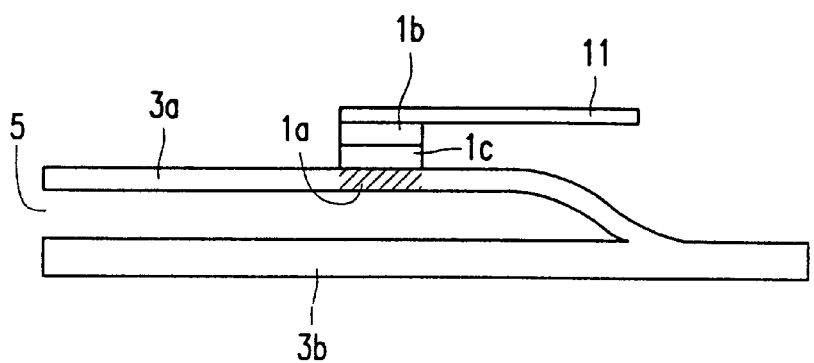
FIG. 2 shows a variant of the subject of FIG. 1, whereby a portion of one of the arms of the yoke constitutes one of the magnetic layers of the STJ.

FIG. 2 depicts a variant of the subject of FIG. 1. In this variant, the role of the discrete first magnetic layer 1a in FIG. 1 is assumed by a first portion of the first yoke-arm 3a (this first portion 1a is hatched in FIG. 2). As a result, the magnetic gap 3a' in FIG. 1 becomes unnecessary, and the yoke-arm 3a is now, therefore, continuous. This simplifies manufacture of the sensor, since:

fewer layers are required (there is no discrete layer 1a necessary);

there is no magnetic gap 3a'.

Embodiment 3

Figure 3:
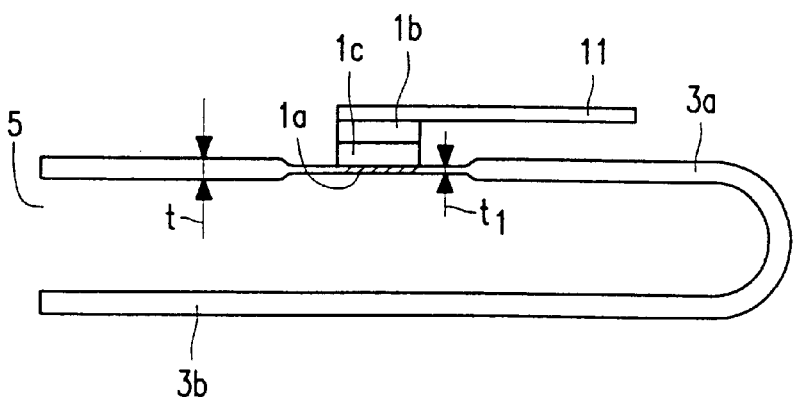
FIG. 3 shows a variant of the subject of FIG. 2, whereby the said portion is of reduced thickness relative to the rest of the yoke-arm.

FIG. 3 shows a variant of the sensor in Embodiment 2. In this variant, the yoke-arm 3a has been thinned in the vicinity of the layer 1c. The thickness $t_1$ of the hatched portion 1a is thus less than the thickness t of the rest of the arm 3a in the immediate vicinity of the portion 1a. As a result, magnetic flux in the arm 3a is concentrated into a smaller volume within the portion 1a, so that there is a greater flux density in proximity to the tunnel barrier 1c; consequently, the sensor can detect external magnetic flux with greater sensitivity.

Embodiment 4

Figure 4:
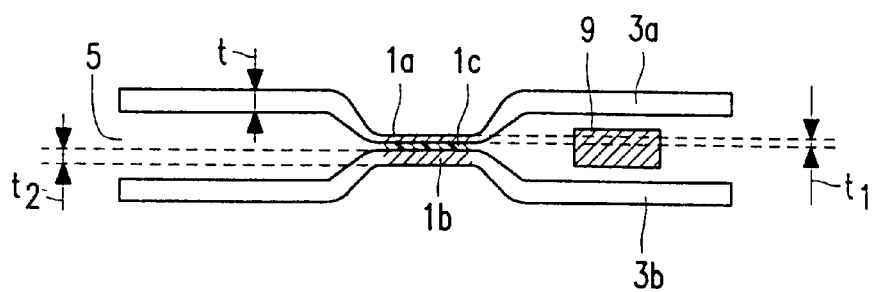
FIG. 4 shows a variant of the subjects of FIGS. 2 and 3, whereby the role of both magnetic layers of the STJ is played by different thinned arms of the yoke.

FIG. 4 shows a sensor which represents an alteration-of the subjects of FIGS. 2 and 3, and is particularly suitable as a sensor with a small characteristic length. In the sensor in FIG. 4, there are no discrete magnetic layers 1a, 1b as in FIG. 1: instead, the role of these layers is played by a first portion of the yoke-arm 3a and a second portion of the yoke-arm 3b, respectively (these portions 1a, 1b are hatched in FIG. 4). These hatched portions 1a, 1b are both thinner than the rest of the yoke-arms 3a,3b of which they are a part, and have respective thicknesses $t_1,t_2$.

So as to prevent short-circuiting, the yoke-arms 3a,3b are not in mutual electrical contact, the distance between the portions 1a, 1b being so small that flux can cross from one portion 1a to the other portion 1b through the intervening electrical insulator layer 1c. Biasing of the magnetizations $M_1,M_2$ in the layers 1a, 1b is achieved with the aid of a biasing conductor 9, which extends into the plane of the Figure and through which an appropriate biasing current can be passed, e.g. so as to achieve 45° quiescent biasing of $M_1$ and $M_2$.

This embodiment is particularly compact, economical and easy to manufacture. In addition, electrical contact with the portions 1a, 1b is conveniently made via the yoke-arms 3a,3b, respectively, so that separate contacting leads (such as the structure 11 in FIGS. 1–3) are unnecessary.

Embodiment 5

Although it will be clear to the skilled artisan, it nevertheless deserves explicit mention that the current invention lends itself to application in multi-track magnetic heads as well as single-track magnetic heads. In the case of a multi-track head, the structures depicted in FIGS. 1–4 extend along an axis A perpendicular to the plane of the Figures, and contain a plurality of STJs 1 disposed along that axis A, one for each track on the recording medium (which is caused to pass before the gap 5). In one specific embodiment, the layer 1a extends continuously along A, whereas the layers 1b,1c extend along A as a series of discrete bi-layer stacks, each being positioned atop the layer 1a so as to positionally correspond to an individual track.

What is claimed is:

1. A magnetic field sensor comprising (1) a Spin Tunnel Junction transducer element comprising a first magnetic layer and a second magnetic layer sandwiched about an interposed electrical insulator layer and (2) a magnetic yoke comprising a first arm and a second arm, the first arm and the second arm being separated from each other, at one end, by a narrow gap, a first portion of the first arm constituting the first magnetic layer of the Spin Tunnel Junction transducer element.

2. A sensor as claimed in claim 1 characterized in that the portion of the first arm constituting the first magnetic layer has a thickness $t_1$ which is less than the thickness of adjacent portions of said first arm.

3. A sensor as claimed in claim 1, characterized in that a portion of the second arm constitutes the second magnetic layer of the Spin Tunnel Junction transducer element.

4. A sensor as claimed in claim 3, characterized in that the portion of the second arm constituting the second magnetic layer has a thickness $t_2$ which is less than the thickness of adjacent portion of said second arm.

5. A magnetic field sensor comprising a spin tunnel junction transducer element comprising a first magnetic layer and a second magnetic layer sandwiched about an interposed electrical insulating layer and, a magnetic yoke comprising a first arm and a second arm, the first arm and the second arm being separated from each other, at one end, by a narrow gap, the first arm having, at another end, a portion in direct contact with one of the two magnetic layers of said spin tunnel junction transducer element.

6. A sensor as claimed in claim 5, characterized in that the gap has a height in the order of about 150–250 nm.

7. A sensor as claimed in claim 1, characterized in that the gap has a height in the order of about 150–250 nm.

8. A sensor according to claim 4, characterized in that $t_2>t_1$.

9. A sensor according to claim 8, characterized in that the value of the ratio $t_2/t_1$ lies in the range 2–30.

10. A sensor according to claim 1, characterized in that a portion of the second arm of the yoke constitutes the second magnetic layer.

11. A sensor according to claim 2, characterized in that a portion of the second arm of the yoke constitutes the second magnetic layer.

12. A sensor according to claim 4, characterized in that a second portion of the second arm of the yoke constitutes the second magnetic layer.

* * * * *